United States Patent
Faul

(10) Patent No.: US 9,837,439 B1
(45) Date of Patent: Dec. 5, 2017

(54) COMPENSATION OF TEMPERATURE EFFECTS IN SEMICONDUCTOR DEVICE STRUCTURES

(71) Applicant: GLOBALFOUNDRIES Inc., Grand Cayman (KY)

(72) Inventor: Juergen Faul, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/235,256

(22) Filed: Aug. 12, 2016

(51) Int. Cl.
*H01L 27/12* (2006.01)
*H01L 23/50* (2006.01)
*H01L 27/02* (2006.01)

(52) U.S. Cl.
CPC .......... *H01L 27/1207* (2013.01); *H01L 23/50* (2013.01); *H01L 27/0288* (2013.01)

(58) Field of Classification Search
CPC ............... H01L 29/0696; H01L 29/404; H01L 29/7391; H01L 29/42368; H01L 29/8611
See application file for complete search history.

(56) References Cited

U.S. PATENT DOCUMENTS

| 8,513,106 B2 * | 8/2013 | Hook | H01L 21/84 257/E27.112 |
| 2014/0017858 A1 * | 1/2014 | Fenouillet-Beranger | H01L 27/1203 438/152 |

* cited by examiner

*Primary Examiner* — Quoc Hoang
(74) *Attorney, Agent, or Firm* — Amerson Law Firm, PLLC

(57) ABSTRACT

The present disclosure provides a semiconductor device structure including a substrate having a semiconductor-on-insulator (SOI) region and a hybrid region, wherein the SOI region and the hybrid region are separated by at least one isolation structure, the SOI region being formed by a semiconductor layer provided over a substrate material and a buried insulating material interposed between the semiconductor layer and the substrate material, a semiconductor device provided in the SOI region, the semiconductor device comprising a gate structure and source and drain regions formed adjacent to the gate structure, and a diode structure provided in the hybrid region, the diode structure comprising a well region doped with dopants of a first conductivity type and a well portion doped with dopants of a second conductivity type embedded into the well region in the hybrid region.

18 Claims, 2 Drawing Sheets

COMPENSATION OF TEMPERATURE EFFECTS IN SEMICONDUCTOR DEVICE STRUCTURES

BACKGROUND

1. Field of the Disclosure

The present disclosure generally relates to a semiconductor device structure, and, more particularly, to a semiconductor device structure capable of compensating for temperature effects of semiconductor devices in SOI technologies.

2. Description of the Related Art

In modern electronic equipment, integrated circuits (ICs) experience a vast applicability in a continuously spreading range of applications. Particularly, the demand for increasing mobility of electronic devices at high performance and low energy consumption drives developments to more and more compact devices having features with sizes ranging even into the deep sub-micron regime; the more so as current semiconductor technologies are apt of producing structures with dimensions in the magnitude of 10 nm. With ICs representing a set of electronic circuit elements integrated on a semiconductor material, normally silicon, ICs can be made much smaller than discreet circuits composed of independent circuit components. The majority of present-day ICs are implemented by using a plurality of circuit elements, such as field effect transistors (FETs), also called metal oxide semiconductor field effect transistors (MOSFETs or simply MOS transistors), and passive elements, such as resistors and capacitors, integrated on a semiconductor substrate with a given surface area. Typically, present-day integrated circuits involve millions of single circuit elements formed on a semiconductor substrate.

The basic function of a FET or a MOSFET is that of an electronic switching element, wherein a current through a channel region between two contact regions, referred to as source and drain, is controlled by a gate electrode, which is disposed over the channel region and to which a voltage relative to source and drain is applied. Particularly, in applying a voltage exceeding a characteristic voltage level to the gate electrode, the conductivity state of a MOSFET is changed and the characteristic voltage level, usually called "threshold voltage," and in the following referred to as "Vt", characterizes the switching behavior of a MOSFET. In general, Vt depends nontrivially on the transistor's properties, e.g., materials, dimensions, etc., such that the implementation of a desired Vt involves plural steps of adjustment and fine-tuning during the fabrication process.

With the continuous scaling down to increasingly small technology nodes in the deep sub-micron regime (at present at 22 nm and beyond), various issues and challenges arise. For example, a precise control of the electrical conductivity of the channel of a MOS transistor is difficult to maintain at very small process geometries. Since the switching behavior of a MOSFET is characterized by the threshold voltage (Vt) of a MOSFET, the precise setting of a definition and control of the threshold voltage (Vt) throughout the fabrication process of semiconductor devices is essential for achieving optimal power consumption and performance of semiconductor device structures. In general, there are several factors which control the threshold voltage (Vt), such as the gate oxide thickness, the work function of the gate and the channel doping, mainly representing independent factors. The scaling of a semiconductor device to more advanced technology nodes led to faster switching and higher current drive behaviors of advanced semiconductor devices, at the expense, however, of a decreased noise margin, increased leakage current and increased power.

Currently, the most common digital integrated circuits built today use CMOS technology, which is fast and offers a high circuit density and low power per gate. CMOS devices or "complementary symmetry metal oxide semiconductor" devices, as sometimes referred to, make use of complementary and symmetrical pairs of P-type and N-type MOSFETs. Two important characteristics of CMOS devices are the high noise immunity and low static power consumption of a CMOS device because the series combination of complementary MOSFETs in a CMOS device draws significant power only momentarily during switching between on- and off-states, since one transistor of a CMOS device is always in the off-state. Consequently, CMOS devices do not produce as much waste heat as other forms of semiconductor devices, for example, transistor-transistor logic (TTL) or NMOS logic devices, which normally have some standing current even when not changing state. In current CMOS technologies, standard transistors and IO devices have the same high-k dielectric and metal electrode, whereas, in comparison with standard devices, the SiO2 oxide of IO devices is thicker.

In general, a MOSFET as fabricated by SOI techniques is a semiconductor device (MOSFET) in which a semiconductor layer (sometime referred to as an active layer), such as silicon, germanium or silicon germanium, is formed on an insulator layer, e.g., a buried oxide (BOX) layer, which is in turn formed on a semiconductor substrate. Conventionally, there are two types of SOI devices: PDSOI (partially depleted SOI) and FDSOI (fully depleted SOI) MOSFETs. For example, in an N-type PDSOI MOSFET, a P-type film being sandwiched between a gate oxide (GOX) and a buried oxide (BOX) is so large that the depletion region cannot cover the whole P-region. Therefore, to some extent, PDSOI devices behave like bulk MOSFETs. In an FDSOI device, the depletion region covers the whole semiconductor layer. As the GOX in FDSOI techniques supports fewer depletion charges than the bulk, an increase in inversion charges occurs in the fully depleted semiconductor layer, resulting in higher switching speeds.

In recent attempts to provide a simple way of meeting power/performance targets, back-biasing was suggested for SOI devices, e.g., in FDSOI devices. Herein, back-biasing consists of applying a voltage just under the BOX of target semiconductor devices. In doing so, the electrostatic control of the semiconductor device is changed and the threshold voltage is shifted to either obtain more drive current (hence, higher performance) at the expense of increased leakage current (forward back bias (FBB)) or to cut leakage current at the expense of reduced performance. While back biasing in planar FDSOI techniques is somewhat similar to body biasing as implemented in bulk CMOS technologies, it offers a number of key advantages in terms of level of efficiency of the bias that may be applied. For example, back-biasing can be utilized in a dynamic way on a block-by-block basis. It can be used to boost performance during the limited periods of time when maximum peak performance is required from that block. It can also be used to cut leakage during the periods of time when limited performance is not an issue.

In typical low voltage applications, the Vt of FET devices is at about 0.2 V. In low standby power/low leakage applications, supply voltages to FET devices may be in the range of about 0.8-1.1 V.

Upon temperature changes, Vt changes and variations in Vt in the range of about 0.8 mV/K are observed. Exposing semiconductor devices to variations in the temperature, Vt may be subjected to unacceptable variations caused by such changes in the temperature. For example, assuming a temperature range in which FET devices may be operated, e.g., between −5° C. and +125° C., deviations of Vt on the order of up to 40% and more may be expected.

In view of the above-described situation, it is desirable to provide a semiconductor device structure that is capable of compensating for temperature effects on a semiconductor device comprised of the semiconductor device structure in the context of SOI techniques, such as FDSOI devices, at advanced technology nodes of 28 nm and beyond.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides in one aspect a semiconductor device structure. In accordance with some illustrative embodiments of the present disclosure, the semiconductor device structure includes a substrate having a semiconductor-on-insulator (SOI) region and a hybrid region, wherein the SOI region and the hybrid region are separated by at least one isolation structure, the SOI region being formed by a semiconductor layer provided over a substrate material, and a buried insulating material interposed between the semiconductor layer and the substrate material, a semiconductor device provided in the SOI region, the semiconductor device comprising a gate structure and source and drain regions formed adjacent to the gate structure, and a diode structure provided in the hybrid region, the diode structure comprising a well region doped with dopants of a first conductivity type and a well portion doped with dopants of a second conductivity type opposite the first conductivity type embedded into the well region in the hybrid region, wherein the well region extends within the substrate material over the SOI region and the hybrid region and is configured to act as a back gate to the semiconductor device. In accordance with some special illustrative embodiments herein, the diode structure may be configured such that the well portion is a base of the diode structure.

BRIEF DESCRIPTION OF THE DRAWINGS

The disclosure may be understood by reference to the following description taken in conjunction with the accompanying drawings, in which like reference numerals identify like elements, and in which.

Figure 1:
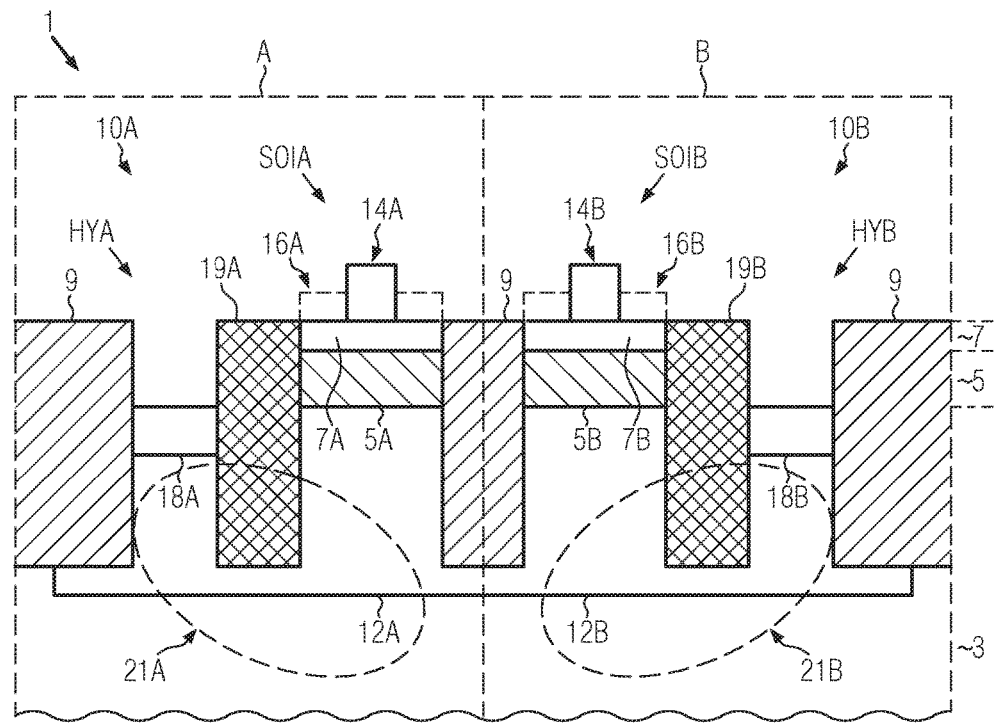
FIG. 1 schematically illustrates in a cross-sectional view a semiconductor device structure in accordance with some illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to a method of forming a semiconductor device and to semiconductor devices, wherein the semiconductor devices are integrated on or in a chip. In accordance with some illustrative embodiments of the present disclosure, the semiconductor devices may substantially represent FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor devices of the present disclosure concern devices which may be fabricated by using advanced technologies, i.e., the semiconductor devices may be fabricated by technologies applied to approach technology nodes smaller than 100 nm, for example, smaller than 50 nm or smaller than 35 nm, e.g., at 28 nm or below. After a complete review of the present application, the person skilled in the art will appreciate that, according to the present disclosure, ground rules smaller or equal to 45 nm, e.g., at 28 nm or below, may be imposed but that the present invention is not limited to such examples. After a complete review of the present application, the person skilled in the art will also appreciate that the present disclosure may be employed in fabricating semiconductor devices with structures of minimal length dimensions and/or width dimensions smaller than 100 nm, for example, smaller than 50 nm or smaller than 35 nm or smaller than 28 nm. For example, the present disclosure may provide semiconductor devices fabricated by using 45 nm technologies or below, e.g., 28 nm or even below.

The person skilled in the art will appreciate that semiconductor devices may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

In general, SOI devices have an active semiconductor layer disposed on a buried insulating material layer, which, in turn, is formed on a base substrate material. In accordance with some illustrative embodiments herein, the active semiconductor layer may comprise one of silicon, germanium, silicon germanium and the like. The buried insulating material layer may comprise an insulating material, e.g., silicon oxide or silicon nitride. The base substrate material may be a base material that may be used as a substrate as known in the art, e.g., silicon and the like. After a complete review of the present application, the person skilled in the art will appreciate that, in accordance with illustrative embodiments employing FDSOI substrates, the active semiconductor layer may have a thickness of about 20 nm or less, while the buried insulating material layer may have a thickness of about 145 nm or, in accordance with advanced techniques, the buried insulating material layer may have a thickness in a range from about 10-30 nm. For example, in some special illustrative embodiments of the present disclosure, the active semiconductor layer may have a thickness of about 6-10 nm.

As to a crystallographic plane orientation of the base substrate material, similar to that of an ordinary silicon device, an SOI substrate whose surface is a face (100) may be used. However, in order to improve the performance of a PMOS semiconductor device, a surface of the PMOS semiconductor device may be used as a face (110). Alternatively, a hybrid plane orientation substrate whose surface may be mixed by a face (100) and a face (110) may be used. With regard to a varactor device, there is no restriction on a crystal plane orientation such that an impurity concentration, film thickness, dimension ratio of the device and the like may be appropriately adjusted to obtain a capacitance characteristic that is suitable according to the plane orientation set by other requirements. In alternative embodiments, the base substrate material may be of an N-type when N-accumulation and/or N-inversion devices are considered (otherwise P-type for P-accumulation and/or P-inversion).

With regard to FIGS. 1 and 2, some illustrative embodiments of the present disclosure will be described in greater detail. FIG. 1 schematically illustrates, in a cross-sectional view, a semiconductor device structure 1 comprising a semiconductor-on-isolator (SOI) substrate configuration which may be formed by a substrate material 3, a buried insulating material 5, and a semiconductor layer 7, wherein the buried insulating material 5 may be interposed between the substrate material 3 and the semiconductor layer 7.

In accordance with some illustrative examples herein, the semiconductor layer 7 may be provided by a semiconductor material, e.g., silicon or silicon germanium, and the semiconductor layer 7 may have a thickness in a range from about 5-10 nm.

In accordance with some illustrative examples herein, the buried insulating material 5 may be a silicon oxide material, e.g., $SiO_2$, and may have a thickness in a range from about 10-30 nm or less than about 30 nm, e.g., 20 nm or less.

In accordance with some illustrative examples herein, the substrate material 3 may be provided by silicon or any other appropriate substrate material as employed in SOI techniques.

In accordance with some illustrative embodiments of the present disclosure, the semiconductor device structure 1 may comprise at least one active region, e.g., a first active region A and a second active region B. The person skilled in the art will appreciate that the number of active regions may be equal to or greater than one, e.g., there may be one active region, two active regions, three active regions and, generally, more than three active regions. Regarding the schematic illustration in FIG. 1, the person skilled in the art will appreciate that this does not limit the present disclosure by any means. For example, the first active region A and the second active region B may be separated by at least one isolation structure 9 (which may be a trench isolation structure) formed in between the first and second active regions A, B. In some examples, at least one further active region (not illustrated) may be located between the first and second active regions A, B.

In accordance with some illustrative embodiments of the present disclosure, the isolation structure 9 may be formed in accordance with known techniques employed for forming trench isolation structures, such as shallow trench isolations (STI), the isolation structures 9 extending through the semiconductor layer 7, and the buried insulating material 5, at least exposing an upper surface of the substrate material 3, if not partially extending into an upper surface region of the substrate material 3. In accordance with some illustrative embodiments of the present disclosure, each of the first and second active regions A, B may be laterally enclosed by the isolation structures 9.

Referring to FIG. 1, a semiconductor device 10A may be provided in a semiconductor-on-isolator (SOI) region SOIA provided in the first active region A, the semiconductor device 10A comprising a gate structure 14A formed in the first active region A of the SOI substrate configuration. Adjacent to the gate structure 14A, source and drain regions 16A may be formed in the SOI region SOIA within the first active region A, the source and drain regions 16A being laterally separated by a channel region extending in a semiconductor layer 7A below the gate structure 14A. The source/drain regions 16A may be provided in some illustrative embodiments of the present disclosure as raised source/drain regions which are indicated in FIG. 1 by means of a broken line adjacent to the gate structure 14A. This does not limit the present disclosure by any means and the semiconductor device 10A may be implemented as a capacitor, a resistor and the like.

In accordance with some illustrative embodiments of the present disclosure, a well region 12A may be formed in a hybrid region HYA within the first active region A, the hybrid region HYA representing a bulk exposed region in which the buried insulating material 5A and the semiconductor layer 7A are removed and an upper surface of the substrate material 3 is exposed to being contacted during subsequent processing. The well region 12A may be doped by dopants of a first conductivity type and the well region 12A may be formed in an upper surface region of the substrate material 3 within the first active region A, e.g., a well region of P-type doping or a well region of N-type doping may be provided by means of the well region 12A. For example, the well region 12A may be formed below the SOI region SOIA and the hybrid region HYA and may extend below the semiconductor device 10A. The well region 12A may have a dopant concentration of less than about $10^{18}/cm^3$, e.g., the dopant concentration may be in a range from about $10^{15}/cm^3$ to about $10^{17}/cm^3$. The person skilled in the art will appreciate that a back gate may be provided by the well region 12A in the first active region A relative to the semiconductor device 10A.

In accordance with some illustrative embodiments of the present disclosure, a well portion 18A of a second conductivity type opposite the first conductivity type, e.g., a well portion of N-type doping in case that the well region 12A is a well portion of P-type doping and vice versa, may be formed within an upper surface region of the substrate material 3 within the first active region A adjacent to the semiconductor device 10A. In accordance with some illustrative embodiments herein, the well portion 18A may be embedded into the well region 12A in the first active region A, such that an upper surface of the well portion 18A lies exposed relative to the well region 12A which laterally surrounds the well portion 18A. A depth of the well portion 18A in the substrate material 3 is smaller than a depth of the well region 12A. In accordance with some explicit examples herein, the well portion 18A may have a dopant concentration of at least about $10^{18}/cm^3$, e.g., the well portion 18A may be of a (P+) doping in case that the well region 12A is of an N doping or (N−) doping and vice versa.

In accordance with some illustrative examples, the SOI region SOIA and the hybrid region HYA may be laterally separated by means of a isolation structure 19A, e.g., an STI structure partially extending into the well region 12A in the substrate material 3. The person skilled in the art will appreciate that the illustrated shallow depth of the isolation structure 19A may be equal to or greater than a depth of the isolation structures 9 within the substrate material 3.

Referring to FIG. 1, a semiconductor device 10B may be provided in a semiconductor-on-isolator (SOI) region SOIB provided in the second active region B, the semiconductor device 10B comprising a gate structure 14B formed in the second active region B of the SOI substrate configuration. Adjacent to the gate structure 14B, source and drain regions 16B may be formed in the SOI region SOIB within the second active region B, the source and drain regions 16B being laterally separated by a channel region extending in a semiconductor layer 7B below the gate structure 14B. The source/drain regions 16B may be provided in some illustrative embodiments of the present disclosure as raised source/drain regions which are indicated in FIG. 1 by means of a broken line adjacent to the gate structure 14B. This does not limit the present disclosure by any means and the semiconductor device 10B may be implemented as a capacitor, a resistor and the like.

In accordance with some illustrative embodiments of the present disclosure, a well region 12B may be formed in a hybrid region HYB within the second active region B, the hybrid region HYB representing a bulk exposed region in which the buried insulating material 5B and the semiconductor layer 7B are removed and an upper surface of the substrate material 3 is exposed to being contacted during subsequent processing. The well region 12B may be doped by dopants of a first conductivity type and the well region 12B may be formed in an upper surface region of the substrate material 3 within the second active region B, e.g., a well region of P-type doping or a well region of N-type doping may be provided by means of the well region 12B. For example, the well region 12 B may be formed below the SOI region SOIB and the hybrid region HYB and may extend below the semiconductor device 10B. The well region 12B may have a dopant concentration of less than about $10^{18}/cm^3$, e.g., the dopant concentration may be in a range from about $10^{15}/cm^3$ to about $10^{17}/cm^3$. The person skilled in the art will appreciate that a back gate may be provided by the well region 12B in the second active region B relative to the semiconductor device 10B.

In accordance with some illustrative embodiments of the present disclosure, a well portion 18B of a second conductivity type opposite the first conductivity type, e.g., a well portion of N-type doping in case that the well region 12B is a well portion of P-type doping and vice versa, may be formed within an upper surface region of the substrate material 3 within the second active region B adjacent to the semiconductor device 10B. In accordance with some illustrative embodiments herein, the well portion 18B may be embedded into the well region 12B in the second active region B, such that an upper surface of the well portion 18B lies exposed relative to the well region 12B which laterally surrounds the well portion 18B. A depth of the well portion 18B in the substrate material 3 is smaller than a depth of the well region 12B. In accordance with some explicit examples herein, the well portion 18B may have a dopant concentration of at least about $10^{18}/cm^3$, e.g., the well portion 18B may be of a (P+) doping in case that the well region 12B is of an N doping or (N−) doping and vice versa.

In accordance with some illustrative examples, the SOI region SOIB and the hybrid region HYB may be laterally separated by means of a isolation structure 19B, e.g., an STI structure partially extending into the well region 12B in the substrate material 3. The person skilled in the art will appreciate that the illustrated shallow depth of the isolation structure 19B may be equal to or greater than a depth of the isolation structures 9 within the substrate material 3.

In accordance with some illustrative embodiments of the present disclosure, the well region 12A and the well portion 18A in FIG. 1 form a diode structure 21A in the first active region A and the well region 12B and the well portion 18B in FIG. 1 form a diode structure 21B in the second active region B.

Although the gate structures 14A and 14B are only schematically illustrated in FIG. 1, the person skilled in the art will appreciate that the gate structures are complex gate structures comprising a gate dielectric (not illustrated) comprising a silicon oxide material layer and/or a high-k material layer and/or a ferroelectric high-k material layer, and an optional work function adjusting material, e.g., TiN, etc., and a gate electrode (not illustrated), e.g., amorphous silicon, polysilicon and an appropriate electrode metal. The person skilled in the art will appreciate that the gate structures 14A, 14B may be formed in accordance with known front end-of-line processes (FEOL) as employed in SOI techniques, such as FDSOI techniques, at advanced technology nodes, e.g., 28 nm and beyond.

Figure 2:
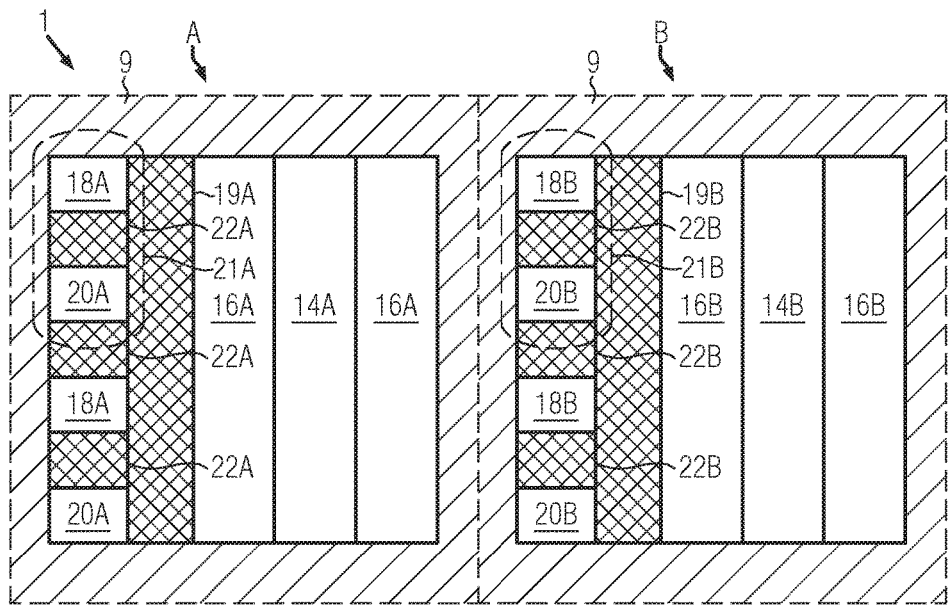
FIG. 2 schematically illustrates a top view of the semiconductor device structure in FIG. 1.

Referring to FIG. 2, a top view of the semiconductor device structure 1 of FIG. 1 is schematically illustrated. Herein, the diode structure 21A is shown to further comprise a well contact portion 20A of the first conductivity type, representing a region within the well region 12A of equal conductivity type but stronger doping. For example, the well contact portion 20A may have a dopant concentration of at least about $10^{18}/cm^3$, e.g., the well contact portion 20A may be of a (P+)-type doping in case that the well region 12A is of a P-type doping or (P−) doping, and the well contact portion 20A may be of an (N+)-type doping in case that the well region 12A is of an N-type doping or (N−)-type doping.

In accordance with some illustrative embodiments of the present disclosure, as schematically illustrated in FIG. 2, the well portion 18A and the well contact portion 20A may be separated by an intermediate isolation structure 22A which may be formed in accordance with the isolation structure 19A.

In accordance with some illustrative embodiments of the present disclosure, the hybrid region HYA in the first active region A may comprise at least one well portion 18A and at least one well contact portion 20A which may be formed along a gate width direction (that is, perpendicular to a direction along which a channel between source and drain extends) and may be disposed in an alternating order (that is, a well portion of N-type is surrounded by well portions of P-type). This does not pose any limitation to the present disclosure and the person skilled in the art will appreciate that adjacent to a well portion, at one side of the well portion, a further well portion may be provided, whereas on the opposite side of the well portion, a well contact portion may be provided.

Referring to FIG. 2, the diode structure 21B is shown to further comprise a well contact portion 20B of the first conductivity type, representing a region within the well region 12B of equal conductivity type but stronger doping. For example, the well contact portion 20B may have a dopant concentration of at least about $10^{18}/cm^3$, e.g., the well contact portion 20B may be of a (P+)-type doping in case that the well region 12B is of a P-type doping or (P−) doping, and the well contact portion 20B may be of an (N+)-type doping in case that the well region 12B is of an N-type doping or (N−)-type doping.

In accordance with some illustrative embodiments of the present disclosure, as schematically illustrated in FIG. 2, the well portion 18B and the well contact portion 20B may be separated by an intermediate isolation structure 22B which may be formed in accordance with the isolation structure 19B.

In accordance with some illustrative embodiments of the present disclosure, the hybrid region HYA in the second active region B may comprise at least one well portion 18B and at least one well contact portion 20B which may be formed along a gate width direction (that is, perpendicular to a direction along which a channel between source and drain extends) and may be disposed in an alternating order (that is, a well portion of N-type is surrounded by well portions of P-type). This does not pose any limitation to the present disclosure and the person skilled in the art will appreciate that adjacent to a well portion, at one side of the well portion, a further well portion may be provided, whereas on the opposite side of the well portion, a well contact portion may be provided.

The semiconductor device structure 1 may be formed during FEOL processing, wherein a SOI substrate configuration is provided (see reference numerals 3, 5, 7 in FIG. 1). At an early stage during processing, the well portions 12A, 12B may be formed in an upper surface of the substrate material 3 by appropriate implantation processes, employing masking of active regions into which dopants of opposite conductivity types are to be implanted. Then, in alignment with the well portions 12A, 12B, the isolation structures 9 may be formed in accordance with known STI techniques. Then, the isolation structures 19A, 19B may be formed in alignment with the well portions 12A, 12B and the isolation structures 9. Then, the well portions 18A, 18B and the well contact portions 20A, 20B may be successively implanted in alignment with the isolation structures 9, 19A, 19B and appropriate masking of active regions and/or portions of active regions into which no implantation is to be performed.

Figure 3:
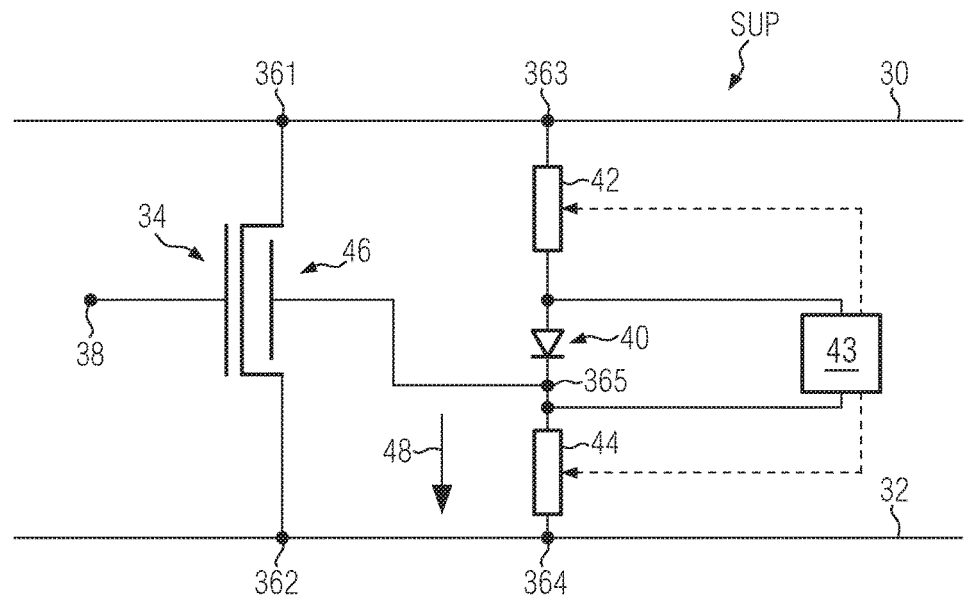
FIG. 3 schematically illustrates a circuit diagram of a semiconductor device structure in accordance with some illustrative embodiments of the present disclosure.

Referring to FIG. 3, a circuit arrangement of a semiconductor device structure in accordance with some illustrative embodiments of the present disclosure is schematically illustrated. Herein, a semiconductor device 34, e.g., a FET device, may be connected between a first supply line 30 and a second supply line 32 and may be connected via contacts 361 and 362. In accordance with some special illustrative examples in which the semiconductor device 34 is a FET device, the semiconductor device 34 may comprise a gate connected to a gate contact 38, and source and drain regions which may be connected to the contacts 361 and 362.

In accordance with some illustrative embodiments of the present disclosure, a diode structure 40 may be coupled to the first supply line 30 and the second supply line 32 in parallel to the semiconductor device 34 via contacts 363 and 364. This does not pose any limitation to the present disclosure and the person skilled in the art will appreciate that the semiconductor device 34 and the diode structure 40 may both not be coupled to the first and second supply lines 30, 32. For instance, the semiconductor device 34 may be coupled to two supply lines different from lines to which the diode structure 40 may be coupled. Alternatively, a switching element (not illustrated) may be located between the contacts 361 and 363 to trip a connection between the contacts 361 and 363. Additionally or alternatively, a switching element (not illustrated) may be located on the second supply line 32 between the contacts 362 and 364 to selectively connect and disconnect the contacts 362 and 364.

In accordance with some illustrative embodiments of the present disclosure, a first resistor 42 may be disposed between the diode structure 40 and the contact 363. Additionally or alternatively, a second resistor 44 may be disposed between the diode structure 40 and the contact 364. After a complete reading of the present disclosure, the person skilled in the art will appreciate that at least one of the first and second resistors 42 and 44 may be implemented as a tunable resistor structure which is electrically coupled to the diode structure 40. In accordance with some special illustrative examples herein, at least one of the first and second resistors 42 and 44 may be formed as one of a metal resistor, a diffusion resistor and a transistor resistor. In accordance with some illustrative examples, at least one of the resistors 42 and 44 may be formed in the SOI substrate configuration as described above with regard to FIGS. 1 and 2.

After a complete reading of the present disclosure, the person skilled in the art will appreciate that the diode structure 40 may basically correspond to the diode structure 21A as described above with regard to FIG. 2. Additionally or alternatively, the semiconductor device 34 may be implemented in accordance with at least one of the semiconductor devices 10A and 10B as described above with regard to FIGS. 1 and 2. For example, a base of the diode structure 40 may implement a back gate 46 to the semiconductor device 34.

In accordance with some illustrative embodiments of the present disclosure, the back gate 46 to the semiconductor device 34 may be connected with the diode structure 40 via a contact 365 formed in between the diode structure 40 and the second supply line 32, e.g., between an emitter-side of the diode structure 40 and the second supply line 32. Alternatively, the contact 365 may be disposed between the first supply line 30 and the diode structure 40, e.g., at a base-side of the diode structure 40.

In accordance with some illustrative embodiments of the present disclosure, a supply circuit arrangement SUP may be provided with the semiconductor device, the supply circuit arrangement SUP comprising the first supply line 30, the second supply line 32, and at least one of the first resistor 42 and the second resistor 44, wherein at least one of the first resistor 42 and the second resistor 44 may be a tunable resistor.

In accordance with some illustrative examples as depicted in FIG. 3, the contact 365 may be located between the diode structure 40 and the second resistor 44. Herein, a voltage drop 48 between the back gate 46 and the second supply line 32 corresponds to a voltage drop over the second resistor 44. Upon adjusting or tuning a voltage drop over the second resistor 44, a voltage drop between the back gate 46 and the second supply line 32 may be adjusted or tuned. In case that the second resistor 44 is a tunable resistor, the voltage between the back gate 46 and the second supply line 32 may be tuned by the second resistor 44.

In accordance with some illustrative embodiments of the present disclosure, the semiconductor device structure as schematically illustrated with regard to FIG. 3 may further comprise a feedback circuit arrangement 43 coupled to the diode structure 40. In accordance with some special illustrative examples, the feedback circuit arrangement 43 may be parallel to the diode structure 40, wherein a voltage over the diode structure 40 may be measured by the feedback circuit arrangement 43. Alternatively, the feedback circuit arrangement 43 may be coupled with the diode structure 40 so as to be in series with the diode structure 40, wherein the feedback circuit arrangement 43 may measure a current through the diode structure 40.

In accordance with some illustrative embodiments of the present disclosure, in which at least one of the first and second resistors 42 and 44 are implemented by a tunable resistor structure, the feedback circuit arrangement 43 may be configured to tune a resistance value of the respective at least one tunable resistor structure. For example, the resistance value of the respective one of the first and second resistors 42 and 44 representing a tunable resistor structure may be tuned in dependent on one of a voltage drop over the diode structure 40 and a current through the diode structure 40.

In accordance with some illustrative embodiments of the present disclosure, a tunable resistor structure may be configured to adjust a potential to be applied to the back gate 46 in dependence on a temperature of the diode structure 40, which is, due to a close location relative to the semiconductor device 34 in case of the illustrative embodiments as described with regard to FIGS. 1 and 2 above, basically also the temperature of the semiconductor device 34. Accordingly, a potential applied to the back gate 46 may be adjusted to adjust a threshold voltage of the semiconductor device 34 in dependence on a temperature at the diode structure 40.

In accordance with some special illustrative examples herein, the first supply line 30 may be coupled to a Vdd line or may be a Vdd line, and the second supply line 32 may be connected to a ground (GND) line and may thus be grounded. In this case, the voltage drop over the second resistor 44 may be substantially the voltage applied to the back gate 46.

After a complete reading of the present disclosure, the person skilled in the art will appreciate that the back gate 46 may correspond to one of the well portions 12A and 12B as described above with regard to FIGS. 1 and 2.

Figure 4:
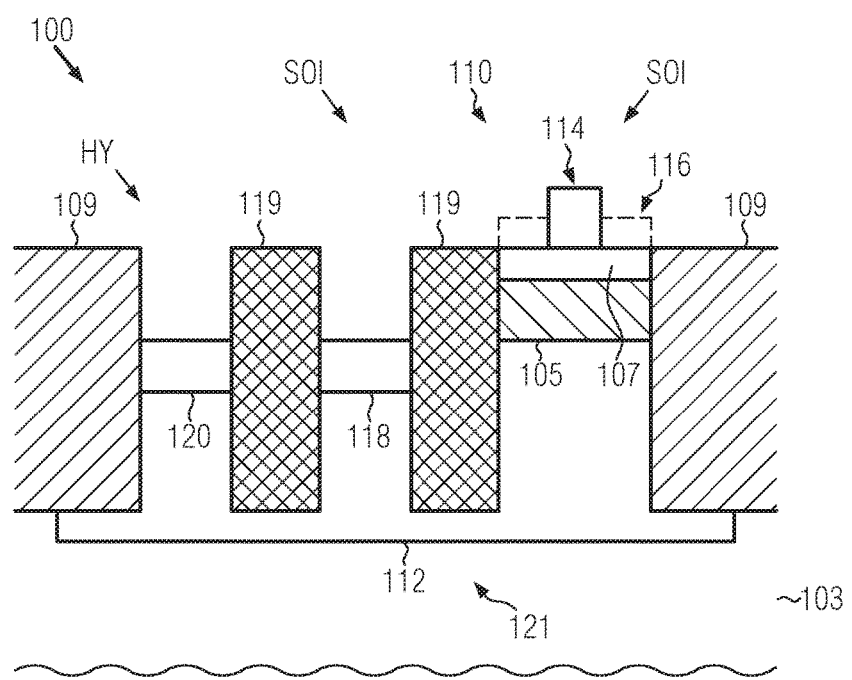
FIG. 4 schematically illustrates a semiconductor device structure in accordance with some other illustrative embodiments of the present disclosure.

Referring to FIG. 4, a semiconductor device structure 100 in accordance with other illustrative embodiments of the present disclosure will be described. In accordance with some illustrative embodiments herein, the semiconductor device structure 100 comprises a semiconductor device 110 comprising a gate structure 114 formed in an SOI region SOI having the SOI substrate configuration. Adjacent to the gate structure 114, source and drain regions 116 may be formed, the source and drain regions 116 being laterally separated by a channel region extending in a semiconductor layer 107 below the gate structure 114. The source/drain regions 116 may be provided in some illustrative embodiments of the present disclosure as raised source/drain regions which are indicated in FIG. 4 by means of a broken line adjacent to the gate structure 114. This does not limit the present disclosure by any means and the semiconductor device 110 may be implemented as a capacitor, a resistor and the like.

In accordance with some illustrative embodiments of the present disclosure, a well region 112 being doped by dopants of a first conductivity type may be formed in an upper surface region of the substrate material 103, e.g., a well portion of P-type doping or a well portion of N-type doping may be provided by means of the well region 112. The well region 112 may have a dopant concentration of less than about $10^{18}/cm^3$, e.g., the dopant concentration may be in a range from about $10^{15}/cm^3$ to about $10^{17}/cm^3$. The person skilled in the art will appreciate that the well region 112 may extend into the SOI region and below the gate structure 114 such that a back gate may be provided by the well region 112 in the semiconductor device structure relative to the semiconductor device 110.

In accordance with some illustrative embodiments of the present disclosure, a hybrid region HY similar to the hybrid regions HYA and HYB as described above with regard to FIGS. 1 and 2 may be provided. In the hybrid region HY, a well portion 118 of a second conductivity type opposite the first conductivity type, e.g., a well portion of N-type doping in case that the well region 112 is a well portion of P-type doping and vice versa, may be formed. The well portion 118 may be located within an upper surface region of the substrate material 103 within the hybrid region HY adjacent the SOI region SOI. In accordance with some illustrative embodiments herein, the well portion 118 may be embedded into the well region 112 such that an upper surface of the well portion 118 lies exposed relative to the well region 112 which laterally surrounds the well portion 118 and from below. A depth of the well portion 118 in the substrate material 103 is smaller than a depth of the well region 112.

In accordance with some explicit examples herein, the well portion 118 may have a dopant concentration of at least about $10^{18}/cm^3$, e.g., the well portion 118 may be of a (P+) doping in case that the well region 112 is of an N doping or (N−) doping and vice versa.

In accordance with some illustrative examples, the hybrid region HY may be laterally separated from SOI region SOI by means of a isolation structure 119, e.g., an STI structure partially extending into the well region 112. The person skilled in the art will appreciate that the illustrated shallow depth of the isolation structure 119 may be equal to or greater than a depth of the isolation structures 109 within the substrate material 103.

In accordance with some illustrative embodiments of the present disclosure, the well portions 112 and 118 in FIG. 4 form a diode structure 121.

As illustrated in FIG. 4, the diode may comprise a well contact portion 120 of the first conductivity type, representing a region within the well region 112 of equal conductivity type but stronger doping. For example, the well contact portion 120 may have a dopant concentration of at least about $10^{18}/cm^3$, e.g., the well contact portion 120 may be of a (P+)-type doping in case that the well region 112 is of a P-type doping or (P−) doping, and the well contact portion 120 may be of an (N+)-type doping in case that the well region 112 is of an N-type doping or (N−)-type doping. The well portion 118 and the well contact portion 120 may be separated by a further isolation structure 119. Herein, the well contact portion 120 may be more distanced relative to the semiconductor device 110 along a gate length direction parallel to a direction along which a channel region between the source and drain regions 116 of the semiconductor device 110 extends.

In accordance with some illustrative embodiments of the present disclosure, the semiconductor device structures 1 and 100 may be implemented wherein the doping of the well portions 12A, 12B and 112 are of opposite doping relative to a doping of the source and drain regions 16A, 16B and 116. For example, the well region 12A may be a P-well, while the source and drain regions 16A are N-type doped. Additionally or alternatively, the well region 12B may be a P-well portion, while the source and drain regions 16B may be of N-type doping. Alternatively of additionally, the back gate 46 may be formed by a P-well, while source and drain of the semiconductor device 34 in the case of a FET device are implemented via N-type doped regions. Alternatively of additionally, the well region 112 may be a P-well, while the source and drain regions 116 may be formed by N-type doping. For example, the well region 12A may be an N-well, while the source and drain regions 16A are P-type doped. Additionally or alternatively, the well region 12B may be an N-well portion, while the source and drain regions 16B may be P-type doped. Alternatively or additionally, the back gate 46 may be formed by an N-well, while source and drain of the semiconductor device 34 in the case of a FET device are implemented via P-type doped regions. Alternatively of additionally, the well region 112 may be an N-well, while the source and drain regions 116 may be P-type doped.

As an alternative to techniques discussed above, so-called flip well techniques may be implemented, in which the type of doping of the well portion for implementing a back gate to the semiconductor device and the doping of the source and drain regions is equal. Accordingly, the well region 12A may be a P-well, while the source and drain regions 16A may be formed by P-type doping. Alternatively or additionally, the well region 12B may be a P-well, while the source and drain regions 16B may be formed by P-type doping. Alternatively or additionally, the back gate 46 may be formed by a P-well, while source and drain regions of the semiconductor device 34 in case that the semiconductor device is implemented as a FET are formed by P-type doping. Alternatively or additionally, the well region 112 may be a P-well, while the source and drain regions 116 may be formed by P-type doping. For example, the well region 12A may be an N-well, while the source and drain regions 16A may be formed by N-type doping. Alternatively or additionally, the well region 12B may be an N-well, while the source and drain regions 16B may be formed by N-type doping. Alternatively or additionally, the back gate 46 may be formed by an N-well, while source and drain regions of the semiconductor device 34 in case that the semiconductor device is implemented as a FET are formed by N-type doping. Alternatively or additionally, the well region 112 may be an N-well, while the source and drain regions 116 may be formed by N-type doping.

In accordance with some illustrative embodiments of the present disclosure, at least one of the semiconductor devices 10A, 10B and 110 may be implemented in accordance with the well techniques discussed above or flip well techniques as described above.

As will be appreciated by those skilled in the art after a complete reading of the present application, the various methods and devices disclosed herein may be employed on semiconductor device structures which are to be applied in low temperature operating conditions that are established based upon product specifications for the intended operating environment of the integrated circuit product. For example, low temperature operations may be operations in which the semiconductor device is not subjected to temperatures more than 150° C., e.g., temperatures in a range from −5° C. to less than 150° C. or in a range from about −5° C. to less than 100° C. or in a range from about −5° C. to less than 50° C., such as at room temperature of about 25° C. In such low temperature operation, a low temperature compensation may be performed where, on the basis of a voltage or current through the diode structure (21A, 21B, 40, 120/118=121) is used to adjust Vt in dependence on an adjustment of a voltage applied to the back gate (12A, 12B, 46, 112).

In some special examples, the resistance value of a tunable resistor structure (42, 44) may be tuned to adjust the back gate potential applied to the back gate (e.g., 46) to a certain point of operation.

In low temperature operations, the flip well technique may be implemented and the back gate may be biased in forward direction. In accordance with some illustrative examples herein, the threshold voltage (Vt) of the semiconductor device (10A, 10B, 110, 34) may be reduced for low temperature operation by increasing the voltage applied to the back gate (12A, 12B, 46, 112) on the basis of a current or voltage at the diode structure (21A, 21B, 40, 121). In accordance with some illustrative examples herein, the voltage applied to the back gate may be adjusted via a feedback loop, i.e., an N-type back gate below an NFET or a P-type back gate below a PFET. These illustrative embodiments may be applied to low voltage applications, e.g., to applications in which the first supply line 30 may be coupled to Vdd in the order of about 0.4 to 0.5V. It is possible to reduce device overdrives defined as Vdd−Vt over a typical standard temperature range, such as a temperature out of a range from about −5° C. to about 125° C., from 0.2V to about 0.1V.

As will also be appreciated by those skilled in the art after a complete reading of the present application, the various methods and devices disclosed herein may also allow for high temperature compensation for semiconductor devices that are intended to operate in high temperature conditions that are established based upon product specifications for the intended operating environment of the integrated circuit product. In accordance with some illustrative examples herein, the threshold voltage at the semiconductor device at elevated temperatures, e.g., at temperatures greater than 150° C. or more, may be increased by reducing the back gate voltage on the basis of the voltage or current through the diode structure. These embodiments may be applied to low standby power applications or low leakage applications which run at higher supply voltages at about Vdd of about 0.8 to 1.1V.

After a complete reading of the present disclosure, the person skilled in the art will appreciate that a voltage over the diode structure 40 may depend on the temperature of the diode 40 according to the formula $U(T)=U(T_0)+c(T-T_0)$, wherein U indicates the voltage over the diode structure 40 at the current temperature (T) of the diode 40, $T_0$ indicates a reference temperature or anticipated operating temperature of the diode 40, $U(T_0)$ indicates the voltage over the diode structure 40 at the reference temperature $T_0$, and c indicates a constant parameter in the range of about −1 to about −3 mV/K. In the case where T is greater than $T_0$, then the voltage across the diode 40 will be greater than U(T). In the case where T is less than $T_0$, then the voltage across the diode 40 will be less than U(T). In effect, changes in the temperature (T) of the diode 40 relative to the reference temperature ($T_0$) causes the voltage across the diode to change which in turn is the voltage applied to the back gate (12A, 12B, 46, 112).

Similarly, the current through the diode structure 40 may depend on the temperature of the diode 40 determined according to the following formula, wherein "m" is a dimensionless factor taking effects caused by the geometry of a diode, materials and so on, into account:

$$I = I_0(e^{U/(m \cdot U(T))} - 1).$$

For example, "m" may be in a range from about 1 to about 2.

As the temperature (T) of the diode 40 goes up, the current (I) through the diode 40 increases relative to a reference current ($I_o$) through the diode 40 at a reference temperature, e.g., room temperature at about 25° C. or the like, the voltage (U(T)) across the diode 40 increases. This increased voltage is, in turn, applied to the back gate (12A, 12B, 46, 112). Conversely, as the temperature (T) of the diode 40 decreases relative to a reference current ($I_o$) through the diode 40, the voltage (U(T)) across the diode 40 decreases. This reduced voltage is, in turn, applied to the back gate (12A, 12B, 46, 112).

In accordance with some illustrative embodiments of the present disclosure, the temperature effect on semiconductor devices may be compensated by changing the working point of a back gate in accordance with a feedback circuit comprising a diode structure. The feedback circuit may comprise a feedback loop with an amplifier/level shifter circuit adjusting the voltage at the back gate in a range between 0 to about Vdd for at least the semiconductor device in an active region or an entire device block.

The diode structures as described above with regard to the FIGS. 1-4 may be biased in the various illustrative embodiments by connecting the first and second supply lines to the well region and well portion of the diode structure such that the diode structure is biased in forward direction of the diode structure. For example, in case that the well region is of P-type doping and the well portion is of N-type doping, the first supply line being a Vdd line may be coupled to the well region and the second supply line being grounded may be coupled to the well portion.

In accordance with various embodiments as described above, a diode structure may be formed in a substrate material below a semiconductor device formed in an SOI region, wherein the diode structure is operated in forward bias mode to provide a back-bias to the semiconductor device. An according semiconductor structure may be used for compensating for temperature effects. A tunable resistor coupled to the diode at its base-side or emitter-side may be used for defining an operating point of the semiconductor device structure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device structure, comprising:
    a substrate having a semiconductor-on-insulator (SOI) region and a hybrid region, wherein said SOI region and said hybrid region are separated by at least one isolation structure, said SOI region being formed by a semiconductor layer provided over a substrate material and a buried insulating material interposed between said semiconductor layer and said substrate material;
    a semiconductor device provided in said SOI region, said semiconductor device comprising a gate structure and source and drain regions formed adjacent to said gate structure;
    a diode structure provided in said hybrid region, said diode structure comprising a well region doped with dopants of a first conductivity type and a well portion doped with dopants of a second conductivity type that is opposite said first conductivity type embedded into said well region in said hybrid region, wherein said well region extends within said substrate material in said SOI region and in said hybrid region and is configured to act as a back gate to said semiconductor device;
    a supply circuit arrangement including first and second supply lines;
    a first resistor coupled between said first supply line and said well portion; and
    a second resistor coupled between said second supply line and said well region, wherein at least one of said first and second resistors comprises a tunable resistor.

2. The semiconductor device structure of claim 1, wherein said first conductivity type comprises a P-type doping, wherein a concentration of dopants in said well region is lower than a concentration of dopants in said well portion.

3. The semiconductor device structure of claim 2, wherein said concentration of dopants in said well region is less than about $10^{18}/cm^3$, and wherein said well portion is doped with N-type dopants with a concentration of more than about $10^{18}/cm^3$.

4. The semiconductor device structure of claim 3, wherein said source and drain regions are formed by raised source and drain regions doped with dopants of said N-type.

5. The semiconductor device structure of claim 2, wherein said first supply line is a Vdd line and said second supply line is grounded.

6. The semiconductor device structure of claim 1, wherein said first conductivity type comprises an N-type doping, wherein a concentration of dopants in said well region is lower than a concentration of dopants in said well portion.

7. The semiconductor device structure of claim 6, wherein said concentration of dopants in said well region is less than about $10^{18}/cm^3$, and wherein said well portion is doped with P-type dopants having a concentration of dopants of more than about $10^{18}/cm^3$.

8. The semiconductor device structure of claim 6, wherein said source and drain regions are formed by raised source and drain regions doped with dopants of said P-type.

9. The semiconductor device structure of claim 6, wherein said first supply line is a Vdd line and said second supply line is grounded.

10. The semiconductor device structure of claim 9, wherein said well region is connected to said second supply line and said well portion is coupled to said first supply line.

11. The semiconductor device structure of claim 1, wherein said source and drain regions are raised source and drain regions doped with N-type dopant, said raised drain region being coupled to said first supply line.

12. The semiconductor device structure of claim 11, wherein said first supply line is at a positive potential of less than +1 V relative to said second supply line.

13. The semiconductor device structure of claim 1, further comprising a feedback circuit arrangement to adjust a resistance of said tunable resistor so as to adjust a threshold voltage (Vt) of said semiconductor device in dependence on an operating temperature of said SOI substrate configuration.

14. The semiconductor device structure of claim 13, wherein said tunable resistor is one of a metal resistor, a diffusion resistor and a transistor resistor.

15. The semiconductor device structure of claim 13, further comprising a feedback circuit arrangement to adjust a resistance of said tunable resistor to adjust a potential applied to said back gate in dependence on an operating temperature of said SOI substrate configuration.

16. The semiconductor device structure of claim 1, wherein a thickness of said buried insulating material is equal to or smaller than about 20 nm.

17. The semiconductor device structure of claim 1, further comprising a feedback circuit arrangement to adjust a resistance of said tunable resistor.

18. The semiconductor device structure of claim 17, wherein said feedback circuit arrangement is connected in parallel with said diode structure.

\* \* \* \* \*